United States Patent
Goshima et al.

[19]

[11] Patent Number: 6,050,287
[45] Date of Patent: Apr. 18, 2000

[54] PURGE SYSTEM AND PURGE JOINT

[75] Inventors: Kenichi Goshima, Kasugai; Yoshihisa Sudo, Tokyo, both of Japan

[73] Assignee: CKD Corporation, Japan

[21] Appl. No.: 09/102,756

[22] Filed: Jun. 23, 1998

[51] Int. Cl.⁷ .................................................. B08B 9/02
[52] U.S. Cl. ........................................ 137/240; 137/798
[58] Field of Search ................................ 137/240, 798

[56] References Cited

U.S. PATENT DOCUMENTS

| | | | |
|---|---|---|---|
| 5,137,047 | 8/1992 | George | 137/240 |
| 5,749,389 | 5/1998 | Ritrosi et al. | 137/15 |

FOREIGN PATENT DOCUMENTS

| | | |
|---|---|---|
| 4-19899 | 3/1992 | Japan . |
| 10-28854 | 2/1998 | Japan . |

*Primary Examiner*—John Fox
*Attorney, Agent, or Firm*—Finnegan, Henderson, Farabow, Garrett & Dunner, L.L.P.

[57] ABSTRACT

A purge system has a purge gas piping system for substituting inert gas for process gas when a device connected in a process gas piping system is detached therefrom. In the purge system, a purge joint for connecting two pipes in the purge gas piping system is provided with an opening formed in alignment with the position where the two pipes are connected in the purge joint.

7 Claims, 6 Drawing Sheets

PURGE SYSTEM AND PURGE JOINT

BACKGROUND OF THE INVENTION

1. Field of the Invention

The present invention relates to a purge system for substituting inert gas for the process gas remaining in a piping system in a semiconductor manufacturing process line and a purge joint provided in the purge system, more particularly to a purge system with a purge joint, whereby an effective purging work of process gas can be performed for a short time for replacement of devices connected in the semiconductor manufacturing process line.

2. Description of Related Art

There have conventionally been used high poisonous gases such as silane gas and the like for process gas in a device or chamber such as a chemical vapor deposition (CVD) device used in a semiconductor manufacturing line. The device is connected to a piping system for process gas in the line and needed to be detached for replacement or maintenance. In that case, the process gas remaining in the device must be replaced completely with inert gas when the device is detached. Therefore, the device is connected to a purge gas piping system for supplying inert gas.

FIG. 5 schematically shows a piping system in a conventional purge system. A device 101 such as a CVD device is connected with a piping system for supplying process gas and purge gas. In the piping system are installed a valve 105 and a joint 104. The joint 104 is connected to a purge gas supply source 110 via a valve 103 and a pressure regulation valve 102. The joint 104 is also connected to a process gas supply source 113 via a valve 112.

The device 101 is also connected with a piping system with an outlet port 111 for recovering process gas. In this piping system are arranged a joint 107 and a valve 106. The joint 107 is connected to the outlet port 111 via a valve 109, and also to a vent 114 for discharging the substituted gas through a valve 108.

In the above conventional purge system, the device 101 is exchanged in the following manner.

First, the valve 112 is closed to stop the flow of process gas and the valve 109 is closed to prevent the flow of the substituted gas to the outlet port 111. Then, the valves 103 and 108 are opened to allow purge gas such as nitrogen gas and the like to flow into the device 101, discharging the mixed gas of the process gas and the nitrogen gas through the vent 114. The substituted gas is discharged through the vent 114, not through the outlet port 111, in order to prevent the mixed gas including nitrogen gas from flowing in a process gas supply piping system. This is because there is a possibility that the mixed gas flowing in the supply piping system for process gas may cause the mixture of water or oxygen in the piping system, which may cause a problem.

The above system, however, has the following disadvantages. The amount of process gas used in the CVD device and the like is very small. The piping systems are so designed for allowing a small amount of gas to flow therein and therefore hard to allow a large amount of nitrogen gas to flow therein, so that it takes a long time to completely substitute nitrogen gas for process gas. This deteriorates a productive efficiency in the semiconductor manufacturing process.

To avoid the problem, a portable gas substitute device has been proposed in Japanese Patent publication No. 4-19899. If connected to a piping system, the gas substitute device can exhaust process gas and fill nitrogen gas in the piping system. More specifically, the device is provided with an exhaust pump, a substitute gas supply part, a pressure gauge, a gas sensor, a tank, and the like, which are mounted on a carriage so that the device is moved close to the piping system to be subjected to the substitution work of gas. Accordingly, this device can perform prompt gas exhaustion/filling for the piping system to be subjected to the substitution of gas. Having only one connecting portion to the piping system and the tank for storing exhaust gas, the device can be portable to enhance the operating efficiency as compared with the conventional processing system.

However, the above purge system disclosed in Japanese Patent publication No. 4-19899 has the disadvantages as below.

The publication disclosing no way of connecting the device, though it is movable, to the piping system to be subjected to the substitution work of gas. It seems that the device needs to be connected to the piping system every purging operation, which is extremely troublesome in operation. There is also a possibility that the rubbing between the device and a metallic pipe to be connected with the device produces particles. Such the particles will cause defects in recent semiconductors with high precision which strictly require the prevention of production of particles.

SUMMARY OF THE INVENTION

The present invention has been made in view of the above circumstances and has an object to overcome the above problems and to provide a purge system and a purge joint whereby an effective purging operation can be performed for a short time, without producing particles.

Additional objects and advantages of the invention will be set forth in part in the description that follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, there is provided a purge system comprising a purge gas piping system for substituting inert gas for process gas when a device connected to a process gas piping system is detached therefrom, the purge system comprising a purge joint for connecting two pipes in the purge gas piping system, and provided with an opening communicated with an outside at a position in alignment with a portion where the two pipes are connected.

According to another aspect of the invention, there is provided a purge joint for connecting two pipes comprising an opening communicated with an outside at a position in alignment with a portion where the two pipes are connected.

The function of the purge system and the purge joint constructed as above is explained below.

A device such as a CVD device is taken away by detaching a joint. The joint, which is generally a screw-type capable of providing a closed space therein, is detached by loosening a screw-threaded part, producing the clearance between two pipes connected by the joint. At this time, the process gas remaining in the pipes tries to leak from the clearance. The joint is provided with an opening at a portion corresponding to the connecting position of the two pipes and the opening is connected to the two-valves and the ejector. The process gas is sucked through the ejector for a predetermined time, for example, for a first few seconds, and discharged through the vent.

Succeedingly, the purge controller controls the two valves so as to be operated alternately every lapse of a predetermined time according to the air timers driven by air or gas. This purge controller is thus driven by air or gas, using no electricity, so that the purge system can be safely used without any special explosion-proof measure even if an explosive process gas is used.

The purge controller including the air timer may be driven by nitrogen gas for convenience, because the nitrogen gas is always supplied for inert gas to the purge system and needs no extra pipe therefor.

The switching of the two valves closes off a communication between the opening of the joint and the ejector and, alternatively, provides a communication between the joint and the nitrogen gas supply source. Accordingly, the nitrogen gas flows through the clearance into the two pipes, and is mixed with the process gas adhered to the wall surface and others of the pipes. After a predetermined time, the purge controller switches the valves again to cause the opening to be disconnected from the nitrogen gas supply source and to be connected to the ejector. Thus, the nitrogen gas mixed with the remaining process gas is sucked and discharged through the ejector.

In this way, the suction operation by the ejector and the purging operation using nitrogen gas are alternately performed according to the operation of the air timer, so that the process gas remaining in the pipes can be all substituted by nitrogen gas for a very short time. The purging operation and detachment of the joint are conducted at the same time, so that the device can efficiently be taken away from the process gas piping system.

In the case of attachment of the device or chamber to the process gas piping system, the suction operation by the ejector and the purging operation using nitrogen gas are also performed at the same time during the attachment work, which achieve an efficient substitution operation of all air or gas in the pipes by nitrogen gas.

BRIEF DESCRIPTION OF THE DRAWINGS

The accompanying drawings, which are incorporated in and constitute a part of this specification illustrate an embodiment of the invention and, together with the description, serve to explain the objects, advantages and principles of the invention. In the drawings.

FIG. 2(*b*) is a cross sectional view of the purge joint;

DETAILED DESCRIPTION OF THE PREFERRED EMBODIMENTS

A detailed description of one preferred embodiment of a purge system and a purge joint embodying the present invention will now be given referring to the accompanying drawings.

Figure 1:
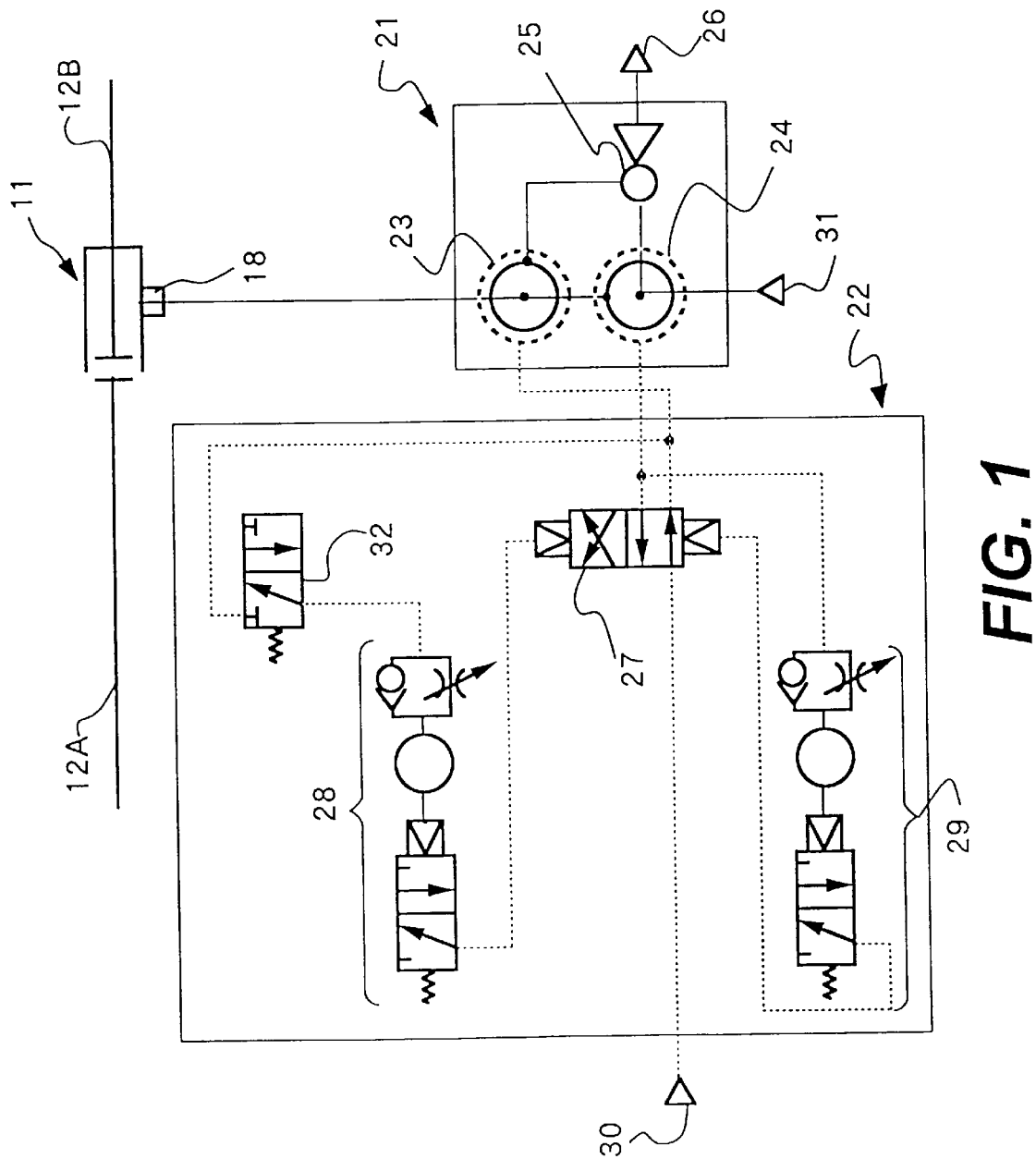
FIG. 1 is a schematic view of a piping system of a purge system in an embodiment according to the present invention.
Figure 2:
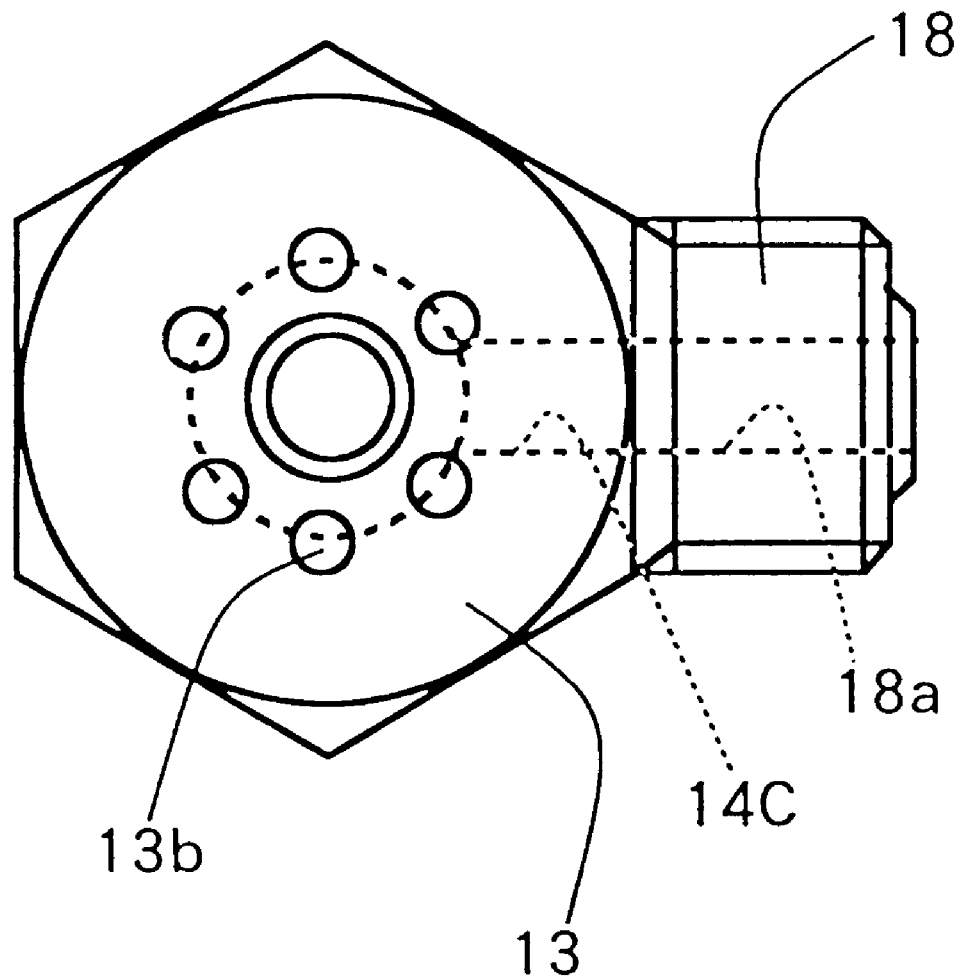
FIG. 2(*a*) is a left side view of a purge joint in the embodiment.
Figure 2:
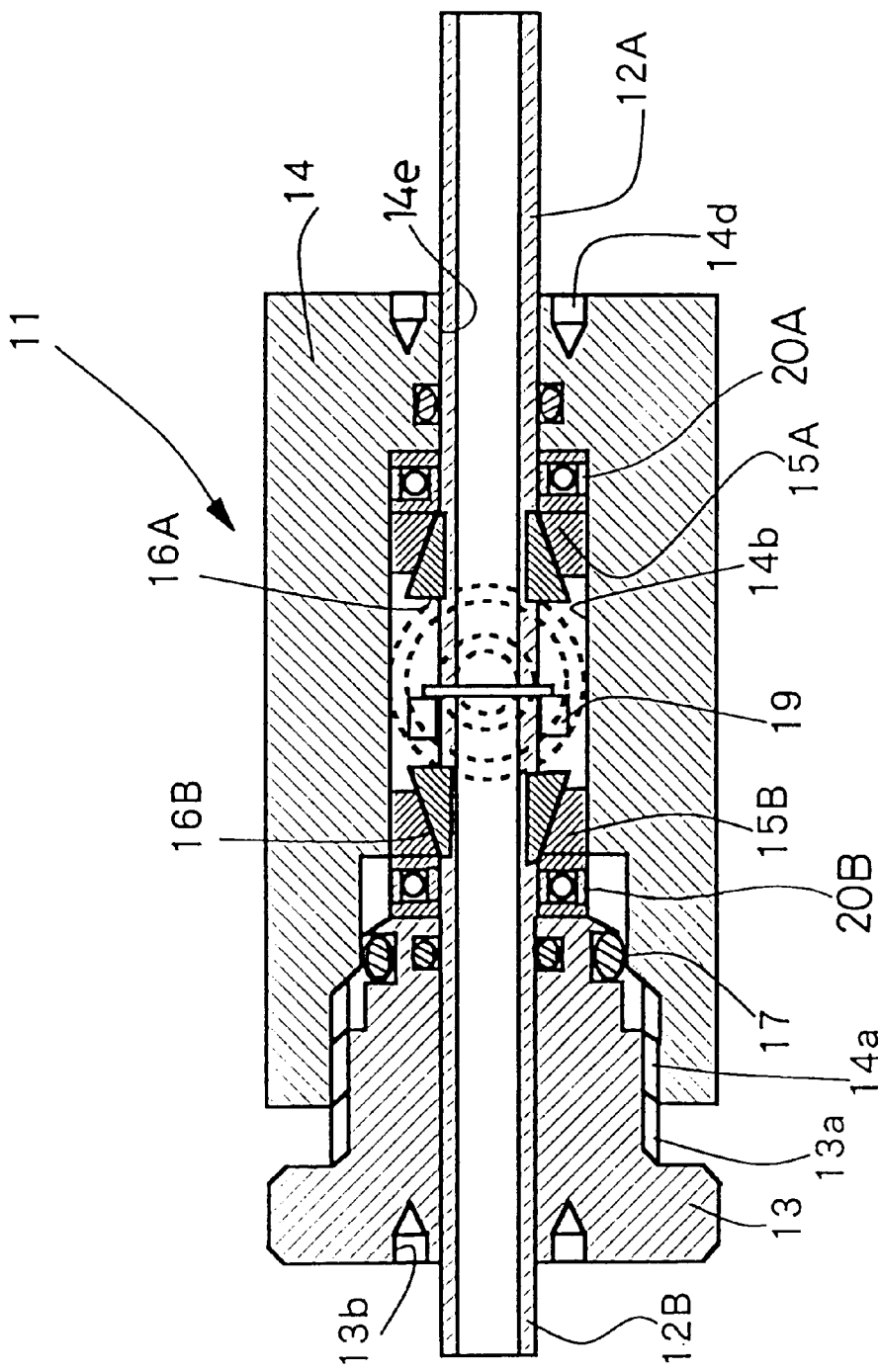
Figure 3:
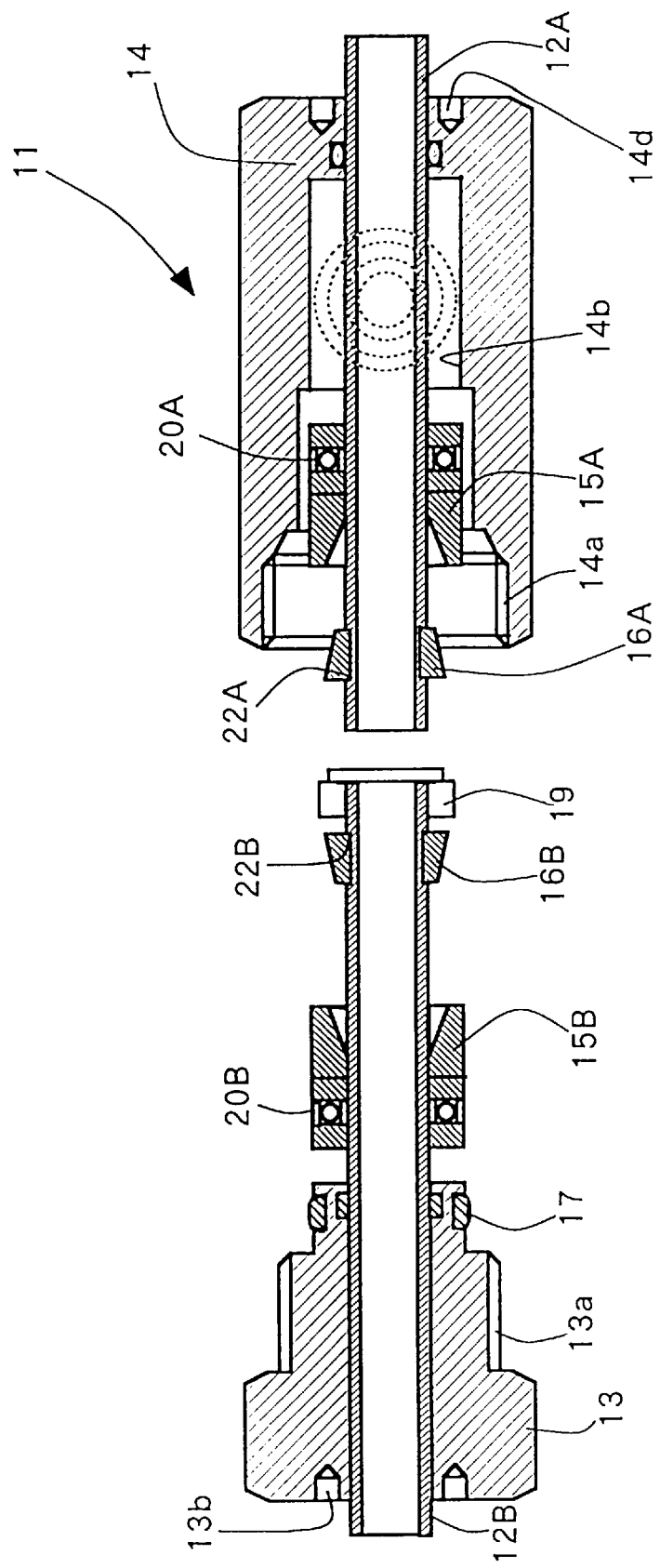
FIG. 3 is an exploded view of the purge joint.
Figure 4:
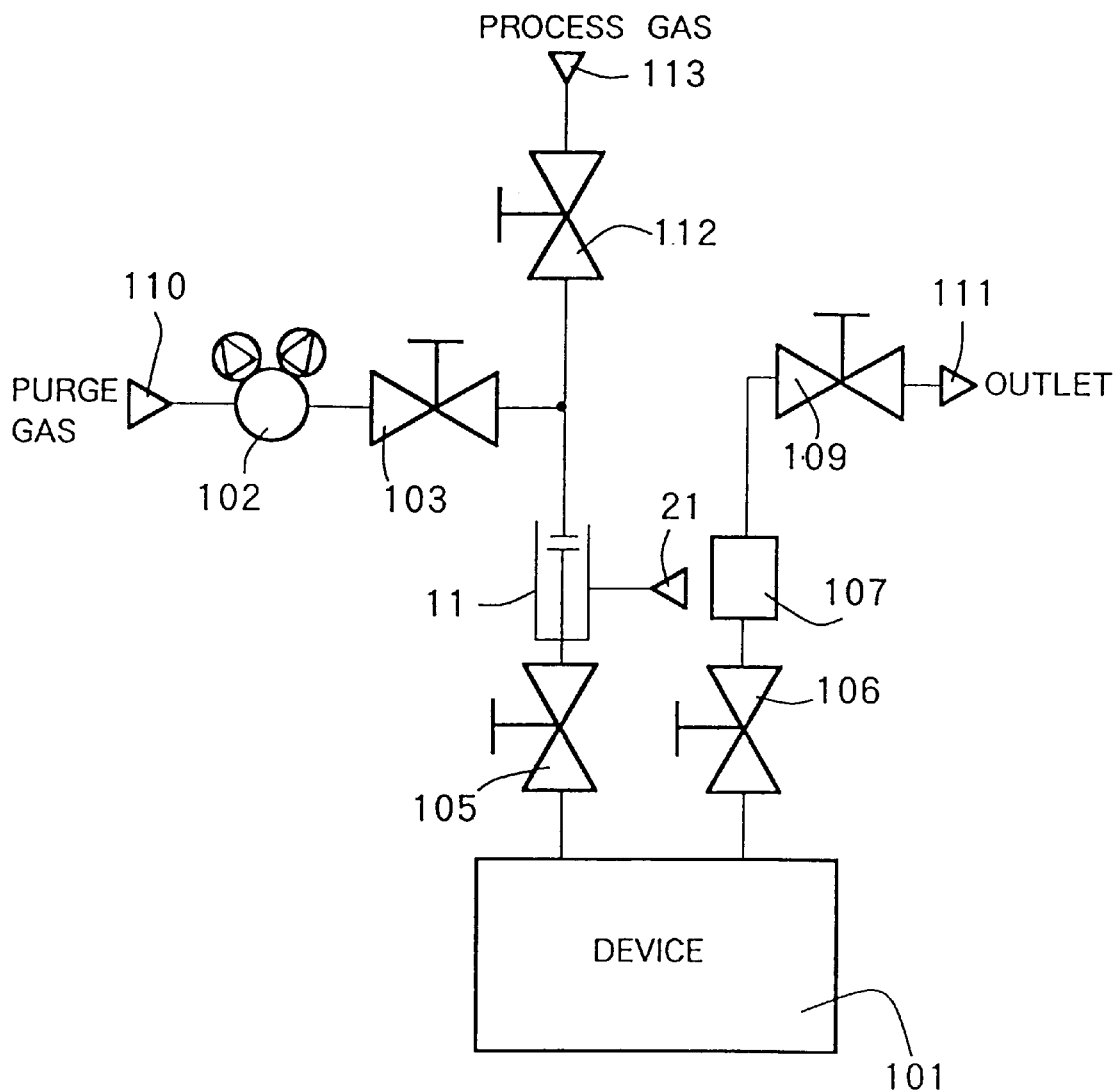
FIG. 4 is a schematic view of a whole purge system in the embodiment.

FIG. 1 shows a piping system of the purge system in the embodiment. FIG. 2(*a*) is a left side view of the purge joint in the embodiment and FIG. 2(*b*) is a cross sectional view of the same. FIG. 3 is an exploded sectional view of the purge joint. FIG. 4 schematically shows a whole structure of the purge system.

Referring to FIGS. 2(*a*) and 2(*b*) and FIG. 3, first, a purge joint 11 will be described below.

The purge joint 11 is a joint for connecting two pipes 12A and 12B and is mainly constituted of a male nut 13 and a joint body 14. FIG. 3 shows the pipe 12B and the male nut 13 on the left side in the drawing and the pipe 12A and the joint body 14 on the right side.

The joint body 14 has six spanner holes 14*d* on the right end plane. The joint body 14 also has a cavity 14*b* and a hole 14*e* formed opening into the center of a right end surface and communicating with the cavity 14*b*. The pipe 12A is inserted through the hole 14*e* into the cavity 14*b* of the joint body 14.

A groove 22A is formed at a predetermined position on a periphery of the pipe 12A, wherein an inner ferrule 16A having a wedge-shaped cross section is engaged. The inner ferrule 16A is provided with a plurality of grooves formed on a periphery thereof so that it is expanded to be fixedly attached in the groove 22A of the pipe 12A. Accordingly, the inner ferrule 16A is moved integrally with the pipe 12A in an axial direction of the pipe.

An outer ferrule 15A is set on the right side of the inner ferrule 16A in FIG. 2 so that they are fitted. Furthermore, a thrust bearing 20A is mounted on the pipe 12A on the right side of the outer ferrule 15A, whereby the pipe 12A does not rotate even if the joint body 14 is rotated.

The cavity 14*b* opens into a left end surface of the joint body 14 and is provided with a stepped inner surface having a large diameter portion 14*a* at a left side. The large diameter portion 14*a* is formed with internal screw-threads. The nut 13 having an external screw-threaded portion 13*a* is screwed into the internal screw-threaded portion 14*a* of the joint body 14. The nut 13 is provided with a center hole through which the pipe 12B is inserted into the cavity 14*b* and also six spanner holes 13*b* on the left end surface.

A groove 22B is formed at a predetermined position on a periphery of the pipe 12B, wherein an inner ferrule 16B having a wedge-shaped cross section is engaged. The inner ferrule 16B is provided with a plurality of grooves formed on a periphery thereof so that it is expanded and thus fixedly attached to the groove 22B of the pipe 12B. Accordingly, the inner ferrule 16B is moved integrally with the pipe 12B in an axial direction of the pipe.

An outer ferrule 15B is set on the left side of the inner ferrule 16B in FIG. 2 so that they are fitted. Furthermore, a thrust bearing 20B is mounted on the pipe 12B on the left side of the outer ferrule 15B, whereby the pipe 12B does not rotate even if the nut 13 is rotated. The outer ferrule 15B is put into contact with the right end plane of the nut 13 through the thrust bearing 20B.

A gasket 19 having a central opening is attached to the right end (in FIG. 2) of the pipe 12B. This gasket 19 is made of soft metal and is sandwiched under pressure between the pipes 12A and 12B, thereby serving as a seal to prevent gas leakage therefrom.

The joint body 14 is further provided with an outer port 14*c* formed in alignment with the position where the pipes 12A and 12B are connected in the cavity 14*b*, namely, with a clearance to be produced between the pipes 12A and 12B. This outer port 14*c* is communicated to a port 18*a* of an outer joint 18 connected with the joint body 14 as shown in FIG. 2(*a*). The outer joint 18 has an external screw-threaded periphery.

The pipes 12A and 12B in a separate state shown in FIG. 3 are connected in a manner such that the pipes 12A and 12B are put into contact with each other through the gasket 19, and then the nut 13 is driven into the joint body 14 until it establishes a connected state shown in FIG. 2(b). At this time, spanners are used to screw the nut 13 with respect to the joint body 14 through the spanner holes 13b and 14d.

The operation of the purge joint 11 is described below. The operation of the outer port 14c will explained later in the purge system.

As the nut 13 is screwed into the joint body 14, the outer ferrule 15B is pushed rightward, pressing the inner ferrule 16B rightward, and pressing the pipe 12B through the groove 22B in a rightward direction in FIG. 2. The pipe 12B is thus put into contact with the pipe 12A through the gasket 19, and further pressed rightward. While the nut 13 is screwed pressing the outer ferrule 15B with respect to the inner ferrule 16B, the pipe 12B can be moved in an axial direction thereof without rotation due to the thrust bearing 20B.

On the other hand, the pipe 12A pushed by the pipe 12B presses the inner ferrule 16A rightward through the groove 22A. The pressing force of the inner ferrule 16A is transmitted to the joint body 14 through the outer ferrule 15A. While the outer ferrule 15A presses the joint body 14, the pipe 12A can be moved in an axial direction thereof without rotation due to the thrust bearing 20A.

In this way, driving the nut 13 into the joint body 14 causes the pipes 12A and 12B to press the gasket 19 therebetween so that the gasket 19 is crushed to seal a clearance between the pipes 12A and 12B. Here, the pipes 12A and 12B are connected with each other so that their connecting portion, namely, the gasket 19 is positioned in alignment with the position of the outer port 14c formed in the joint body 14, as shown in FIG. 2(b).

Figure 5:
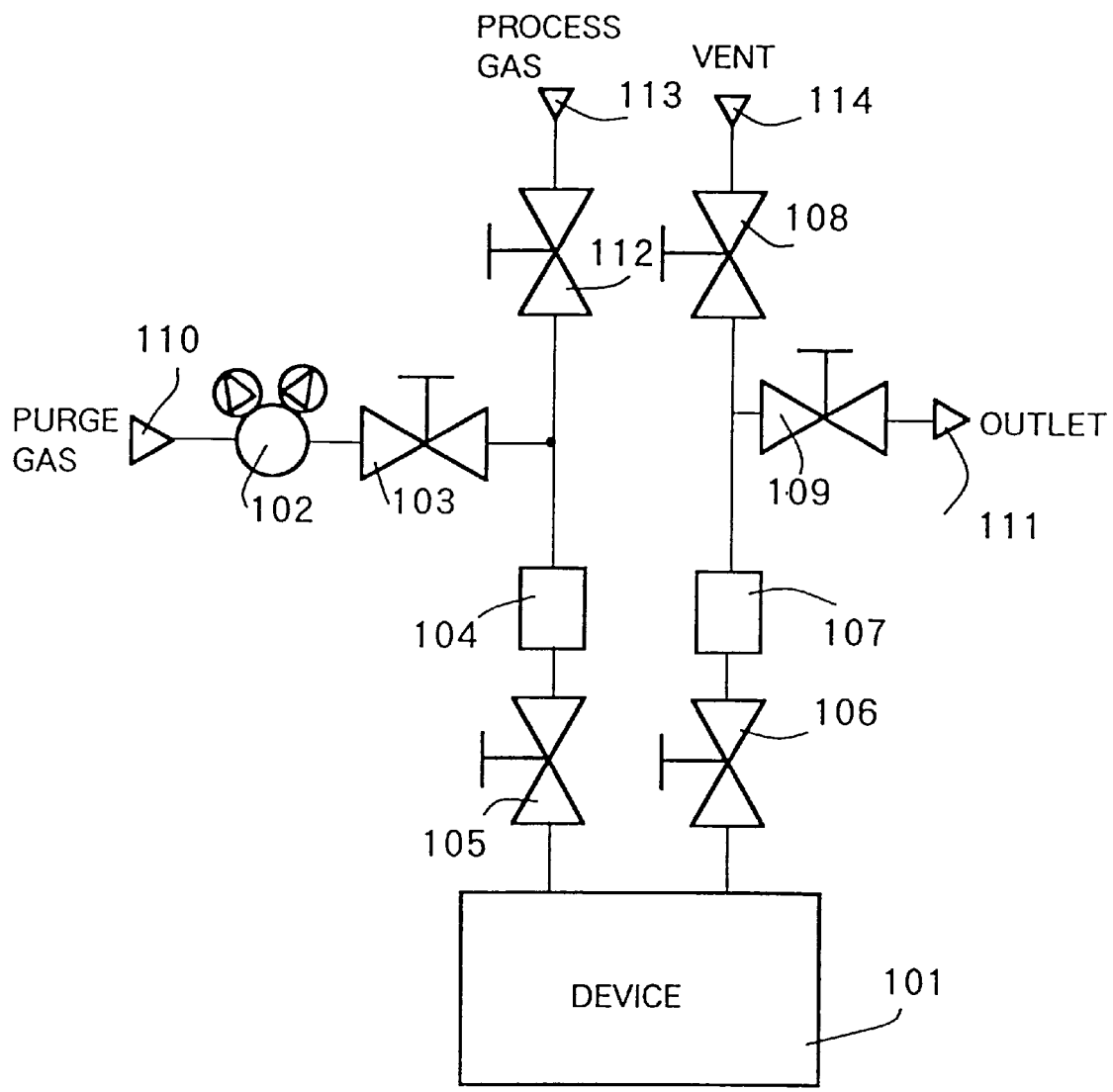
FIG. 5 is a schematic view of a whole conventional purge system.

Next, a whole structure of the purge system is explained with reference to FIGS. 1 and 4. FIG. 4 schematically shows a whole purge system, wherein like numerals refer to like parts in the conventional system shown in FIG. 5.

A device 101, for example, a CVD device is connected with a piping system for supplying process gas and purge gas to the device 101 through a valve 105 and the purge joint 11. The pipe 12A of the purge joint 11 is connected to a purge gas supply source 110 through a valve 103 and a pressure regulation valve 102. Similarly, the pipe 12A is connected to a process gas supply source 113 through a valve 112.

The device 101 is also connected via a valve 106 and a joint 107 to another piping system communicating to an outlet port 111 for recovering process gas. The joint 107 is connected to the outlet port 111 through a valve 109.

The outer joint 18 of the purge joint 11 is connected to a purge unit 21. This purge unit 21, as shown in FIG. 1, is constituted of an exhaust valve 23, a purge gas valve 24, and an ejector 25. The exhaust valve 23 is connected to an exhaust vent 26 through the ejector 25, to the outer joint 18 of the purge joint 11, and to the purge gas valve 24, individually. The purge gas valve 24 is connected to the exhaust vent 26 through the ejector 25, and also to a purge gas source 31.

The control part of the exhaust valve 23 and the purge gas valve 24 is connected to a master valve 27 and a hand valve 32 in a purge controller 22.

The purge controller 22 includes the master valve 27, a first air timer 28, a second air timer 29, and the hand valve 32. The control part of the master valve 27 is connected to the first and second air timers 28 and 29, and also to a drive pressure source 30. The drive pressure source 30 in the present embodiment uses nitrogen gas, which is used for purge gas, for drive pressure gas because the pipe for purge gas is conveniently disposed near the drive pressure source 30, needing no special pipe.

Meanwhile, the steps of exchanging the device 101 in the above constructed system are explained below. First, detachment of the purge joint 11 is described.

The valve 112 is closed to stop the flow of process gas to the device 101. The valve 109 is closed at the same time to prevent the substituted gas from flowing in the outlet port 111.

In a preparation work, on the other hand, purge gas is supplied to the ejector 25 thereby to put it in an operating condition. Then, when the drive pressure source 30 supplies the gas for drive pressure to the exhaust valve 23, the exhaust valve 23 is operated to start an exhaust operation of the purge joint 11. The nut 13 in the purge joint 11 is then loosened from the joint body 14.

Simultaneously, the hand valve 32 is operated to turn on, thereby allowing the gas for drive pressure to start to fill the first air timer 28. During filling, the drive pressure gas maintains the exhaust valve 23 in an ON state so that the ejector 25 evacuates the gas remaining in the joint body 14 through the vent 26.

The second air timer 29 that receives no supply of drive pressure gas remains at rest and the purge gas valve 24 is in an OFF state accordingly.

Filled up with the driving pressure, the first air timer 28 is switched to change over the master valve 27. The switching of the master valve 27 stops the supply of drive pressure gas to the first air timer 28, and the filled gas in the first air timer 28 is discharged through the master valve 27. The exhaust valve 23 is put into an OFF state at the same time.

The switching of the master valve 27 also starts the supply of drive pressure gas to the second air timer 29. The drive, pressure turns the purge gas valve 24 in an ON state so that the purge gas source 31 is communicated with the outer joint 18, supplying purge gas to the purge joint 11.

Filled up with the driving pressure, similarly, the second air timer 29 is switched to change over the master valve 27. The switching of the master valve 27 stops the supply of drive pressure gas to the second air timer 29, and the filled gas in the second air timer 29 is discharged through the master valve 27.

The alternate switching between the first and second air timers 28 and 29 every lapse of a preset time causes the purging (filling) operation and the suction (exhaust) operation.

In the present embodiment, the preset time for switching the first and second air timers 28 and 29 is determined to be a second so that the purging operation and the suction operation are alternately and repeatedly performed every second. Finally, the purge system is stopped after lapse of about 20 seconds because sufficient results can be obtained if the purging/suction operations are repeated about ten times.

To stop the purge system during the purging/suction operations, the hand valve 32 is turned off.

If the hand valve 32 is turned off during the exhaust operation, the supply of the drive pressure gas to the first air timer 28 is stopped, while the exhaust valve 23 remains being on, maintaining the exhaust operation through the ejector 25. Succeedingly, the pressure source 30 is stopped supplying the gas for drive pressure, causing the exhaust valve 23 to be put in an OFF state, while the outer port 14c of the joint body 14 maintains an exhaust condition. When the supply of purge gas from the purge gas source 31 is stopped, the ejector 25 is stopped. Consequently, the purge system comes to a full stop.

If the hand valve 32 is turned off during the purging operation, on the other hand, the purge gas valve 24 is in an ON state until the second air timer 29 is filled up with the gas for drive pressure. Upon completion of filling of the gas, the second air timer 29 is switched to change over the master valve 27. At this time, the hand valve 32 being in an OFF state, the drive pressure gas is not supplied to the first air timer 28. The drive pressure gas, on the other hand, causes the exhaust valve 23 to be put in an ON state to maintain the purge joint 11 in the exhaust state through the ejector 25. When the purge gas supply is then ceased, the ejector 25 is stopped. Consequently, the purge system comes to a full stop.

Accordingly, the removal of the purge joint 11 can be safely performed because nitrogen gas has substituted for the process gas in the joint 11.

The attachment of the purge joint 11 to the system can be carried out in the above steps in reverse order. A detailed description thereof is omitted accordingly.

As described above in detail, the purge system in the embodiment is provided with a purge gas piping system for substituting inert gas for the process gas in order to detach the device 101 connected to the process gas piping system, and the purge joint 11 in which the pipes 12A and 12B are connected. The purge joint 11 is provided with the outer port 14c formed in alignment with the connecting portion between the pipes 12A and 12B. Accordingly, the purge system can perform a purging operation with the pipes arranged in a regular state, thus achieving a prompt and simple detachment of the device 101.

At the time of disconnection or connection of the pipes 12A and 12B through the purge joint 11, a purging operation using inert gas is simultaneously performed, so that the time needed only for the purging operation can be largely reduced.

In the purge unit 21 connected to the outer port 14c of the purge joint 11 and provided with the exhaust valve 23, the purge gas valve 24, and the ejector 25, the exhaust valve 23 and the purge gas valve 24 are alternately operated to repeat the purging operation using inert gas and the vacuum-exhaust or suction operation with the ejector 25 by turns, enabling the purging operation with the pipes arranged in a regular state. This makes it possible to promptly and simply detach the device 101.

The exhaust valve 23 and the purge gas valve 24 are controlled by the purge controller 22 including the first and second timers 28 and 29 which use inert gas for operating gas, instead of using an electric system. This provides high explosion-proof. Accordingly, no problem occurs even if explosive gas is used for process gas.

The present invention may be embodied in other specific forms without departing from the spirit or essential characteristics thereof. For instance, although the hand valve enables the purge system operation in the above embodiment, the purge system may be worked automatically by detecting the detachment of the purge joint 11.

Also, although the suction operation is performed by the ejector 25 in the embodiment, it may be conducted by a vacuum pump.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A purge system comprising a purge gas piping system for substituting inert gas for process gas when a device connected to a process gas piping system is detached therefrom, the purge system comprising:

a purge joint for connecting two pipes in the purge gas piping system, and provided with an opening communicated with an outside at a position in alignment with a portion where the two pipes are connected.

2. A purge system according to claim 1, wherein a purging operation using the inert gas is performed when the two pipes are disconnected or connected through the purge joint.

3. A purge system according to claim 1, further comprising a purge unit provided with two valves and an ejector and connected to the opening of the purge joint, wherein the two valves are alternately operated to repeat a purging operation using the inert gas and a vacuum-exhaust operation through the ejector by turns.

4. A purge system according to claim 3, wherein the two valves are controlled by a purge controller comprising air timers using the inert gas for operating gas.

5. A purge system according to claim 2, further comprising a purge unit provided with two valves and an ejector and connected to the opening of the purge joint, wherein the two valves are alternately operated to repeat a purging operation using the inert gas and a vacuum-exhaust operation through the ejector by turns.

6. A purge system according to claim 5, wherein the two valves are controlled by a purge controller comprising air timers using the inert gas for operating gas.

7. A purge system according to claim 1, further comprising a purge valve connected to the opening of the purge joint.

* * * * *